(12) United States Patent
Chen et al.

(10) Patent No.: US 7,557,306 B2
(45) Date of Patent: Jul. 7, 2009

(54) SHIELD ASSEMBLY WITH GASKETS

(75) Inventors: Jian-Ping Chen, Shenzhen (CN); Wan-Cheng Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 33 days.

(21) Appl. No.: 11/556,197

(22) Filed: Nov. 3, 2006

(65) Prior Publication Data
US 2008/0047746 A1  Feb. 28, 2008

(30) Foreign Application Priority Data
Aug. 11, 2006  (TW) .............................. 95214188 U

(51) Int. Cl.
*H05K 9/00* (2006.01)
(52) U.S. Cl. ........................ 174/382; 174/377; 361/818
(58) Field of Classification Search ................. 174/369, 174/377, 382; 361/816, 818, 800
See application file for complete search history.

(56) References Cited

U.S. PATENT DOCUMENTS

| 6,878,872 | B2 * | 4/2005 | Lloyd et al. ................. 174/384 |
| 2003/0169581 | A1 * | 9/2003 | Bright et al. ................ 361/816 |

* cited by examiner

*Primary Examiner*—Hung V Ngo
(74) *Attorney, Agent, or Firm*—Wei Te Chung

(57) ABSTRACT

A shielding assembly includes a cage (40), a shielding plate (10), and a gasket (50). The cage includes a front end portion (41), a rear end portion (43) opposite to the front end portion, a plurality of clips (45) protruding from the front end portion, a pair of sidewalls (44), and a back wall (46). The shielding plate attached to the front end portion of the cage, includes a main portion (12), a plurality of resilient tabs (14) projecting from an inner surface of the main portion, and a plurality of through hatches (16) in the main portion for receiving the clips. The gasket is attached to the rear end portion and abuts against outer surfaces (49) of the sidewalls and the back wall.

16 Claims, 5 Drawing Sheets

SHIELD ASSEMBLY WITH GASKETS

BACKGROUND OF THE INVENTION

1. Field of the Invention

The present invention relates to a shield assembly for shielding electromagnetic interference (EMI), and specifically to a shield assembly with gaskets configured for shielding transceiver module from EMI.

2. Description of Related Art

Transceiver modules provide bi-directional transmission of data between an electrical interface and an optical data link. The module receives electrical signals and converts them into optical signals that are then transmitted over the optical data link. The module also receives optical signals, converts them into electrical signals, and transmits the electrical signals to the electrical interface.

Conventionally, the module connected to a metal cage is mounted on a printed circuit board (PCB) of a host computer, an input/output system, a peripheral device, or a switch. The metal cage functions to dissipate electrostatic buildup, and serves as an electromagnetic shield. The cage often includes a pair of parallel sidewalls, a top wall, a bottom wall, a front end portion, and a rear end portion. In assembly, the cage is mounted on the PCB, then the PCB is installed in a device with the front end portion of the cage is inserted into an opening of a front panel of the device. The module is inserted into the cage through the opening of the front panel.

However, there are gaps between the front panel of the device and the cage, between the cage and the PCB, and between the front end portion and the module, thereby the cage does not effectively shield the module from external electromagnetic waves, and also does not effectively contain electromagnetic waves emanating from the module.

Therefore, a heretofore unaddressed need exists in the industry to overcome the aforementioned deficiencies and inadequacies.

SUMMARY OF THE INVENTION

In one aspect of the embodiment, a shielding assembly mounted on a circuit board includes a cage, a shielding plate, a supporting frame, and a gasket. The cage includes an outer surface, a front end portion, a rear end portion opposite to the front end portion, a plurality of stop portions, and a plurality of clips. The stop portions and the clips respectively protrude from the outer surface. The shielding plate is mounted to a front portion of the cage, and includes a main portion, a plurality of tabs projecting from an inner surface of the main portion and configured for reducing electromagnetic interference, and a plurality of hatches for receiving the clips. The supporting frame is installable on the front end portion and overlaps the shielding plate. The supporting frame includes a supporting body and a plurality of supporting portions extending from the body portion. The gasket overlaps the shielding plate and the supporting frame. The gasket includes a rear surface abutting against the supporting portions.

In another aspect of the embodiment, a shielding assembly is configured for protecting an electrical module from electromagnetic interference. The shielding assembly includes a cage, a shielding plate, and a gasket. The cage includes a front end portion, a rear end portion opposite to the front end portion, a plurality of clips protruding from the front end portion, a top wall, a pair of parallel sidewalls, and a back wall. The shielding plate attached to the front end portion of the cage, includes a main portion, a plurality of resilient tabs projecting from an inner surface of the main portion and configured for reducing electromagnetic interference, and a plurality of through hatches in the main portion for receiving the clips. The gasket is attached to the rear end portion and abuts against outer surfaces of the sidewalls and the back wall.

Other advantages and novel features will become more apparent from the following detailed description when taken in conjunction with the accompanying drawings, in which:

DETAILED DESCRIPTION OF THE INVENTION

Figure 1:
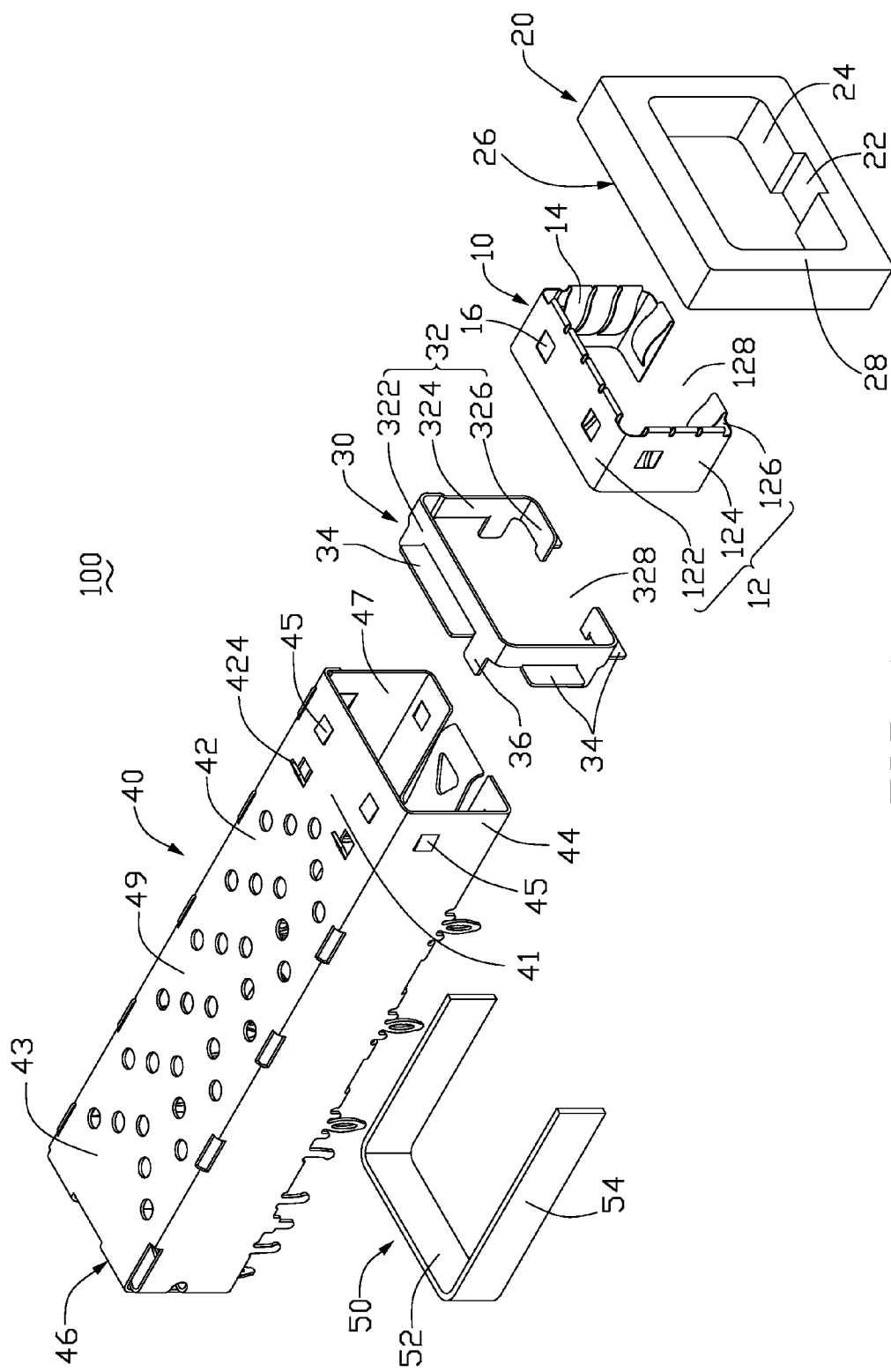
FIG. 1 is an exploded, perspective view of a shielding assembly in accordance with an exemplary embodiment of the present invention, the shielding assembly including a cage, a first gasket, a second gasket, a supporting frame, and a shielding frame.
Figure 4:
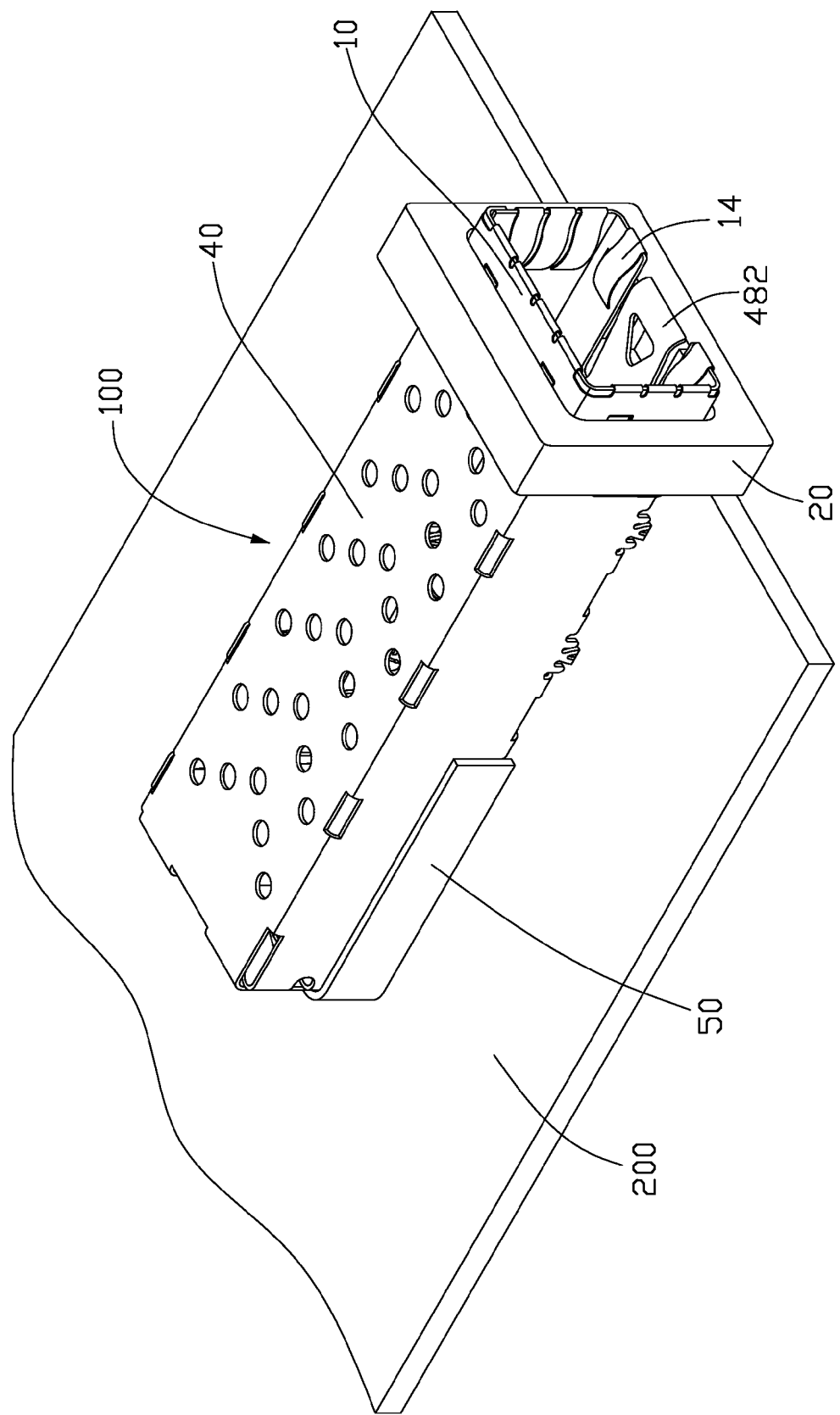
FIG. 4 is an assembled view of the shielding assembly mounted on a circuit board.

Referring to FIGS. 1 and 4, a shielding assembly 100 of an exemplary embodiment of the present invention is shown. The shielding assembly 100 is mounted on a circuit board 200. The shielding assembly 100 includes a shielding plate 10, a first gasket 20, a supporting frame 30, a cage 40, and a second gasket 50.

Figure 2:
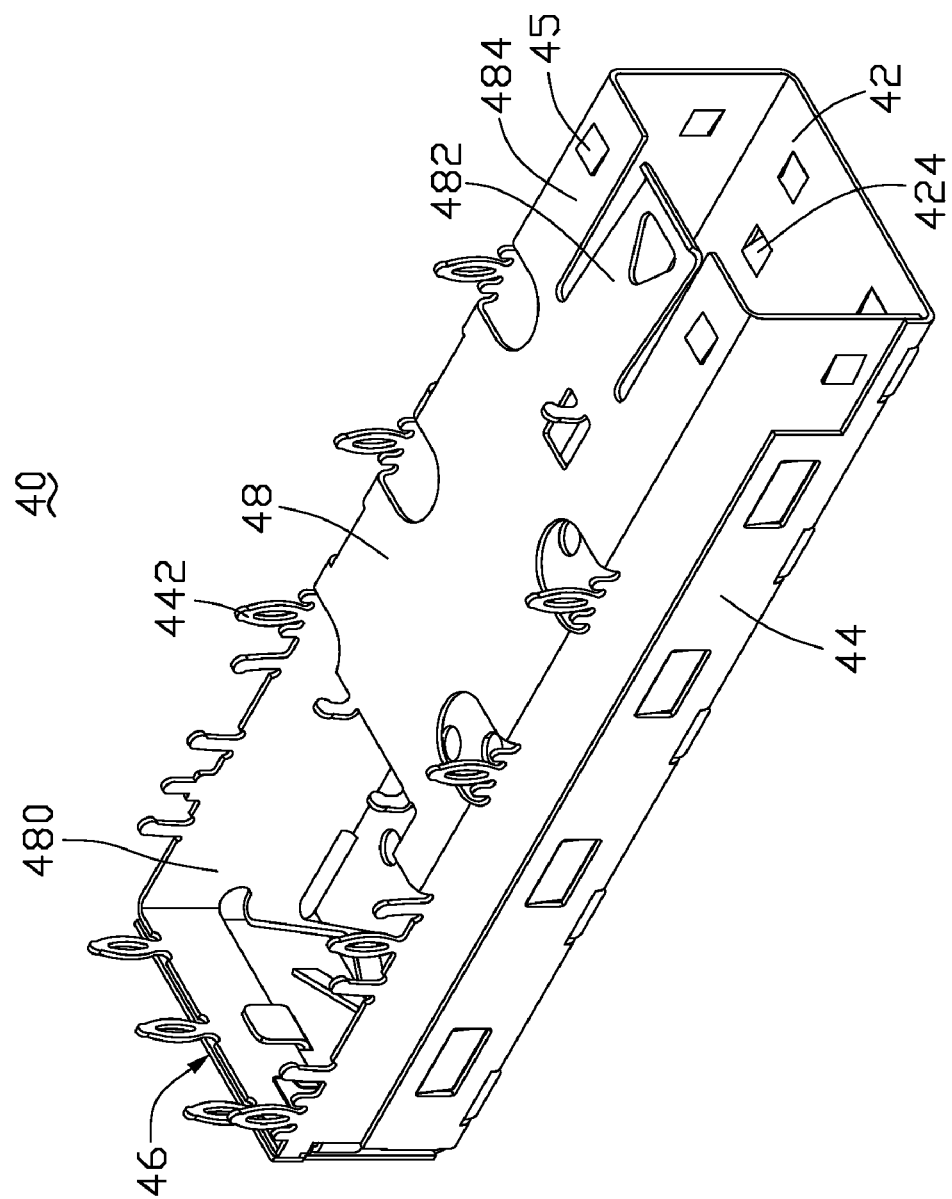
FIG. 2 is an inverted view of the cage of FIG. 1.

Referring also to FIG. 2, the cage 40 is configured for housing a module (not shown), and shielding the module from external electromagnetic waves, as well as containing electromagnetic waves emanating from the module. The cage 40 is substantially rectangular and it will be understood that other configurations may be utilized. The cage 40 is constructed from sheet metal, and includes a top wall 42, a pair of parallel sidewalls 44, a back wall 46 perpendicularly connected to the top wall 42 and the sidewalls 44, a bottom wall 48 parallel to the top wall 42, a front end portion 41, and rear end portion 43 opposite to the front end portion 41. The top wall 42, the sidewalls 44, the back wall 46, and the bottom wall 48 cooperatively bound a receiving space 400 for receiving the module. A plurality of legs 442 extends from a bottom edge of each of the sidewalls 44 toward the circuit board 200. The legs 442 are configured for installing the cage 100 on the circuit board 200. An opening 480 is defined in the rear end portion 43 of the bottom wall 48, and communicates with the receiving space 400. A connector (not shown) mounted on the circuit board 200 is electrically connected to the module via the opening 480. The bottom wall 48 includes a tongue 482 at a front end thereof, and a pair of locating plates 484 located at two sides of the tongue 482.

The cage 40 further includes an outer surface 49, an inner surface 47 opposite to the outer surface 49, and a plurality of stop portions 424, and a plurality of clips 45. The stop portions 424 are stamped outward from the inner surface 47 to the outer surface 49 in the top wall 42. The clips 45 are stamped outward from the inner surface 47 to the outer surface 49 in the sidewalls 44, the top wall 42, and the bottom wall 48. Distal ends of the stop portions 424 and the clips 45 in the top wall 42 extend toward each other.

The shielding plate 10 is metal, and is mounted to the front end portion 41 of the cage 40. The shielding plate 10 includes a main portion 12, a plurality of resilient tabs 14 projecting from an inner surface of the main portion 12 and configured for additional electromagnetic interference (EMI) shielding, and a plurality of hatches 16 extending through the main portion 12 for receiving the clips 45 of the cage 40. The main portion 12 includes a top plate 122, a pair of bottom plates 126, a pair of side plates 124 interconnecting the top plate 122 and the side plates 124, and an aperture 128 between the two bottom plates 126 to enhance resilience of the shielding plate 10. A width of the aperture 128 is slightly greater than that of the tongue 482.

An improved electrical connection between the cage 40 and a front panel 300 of a device (see FIG. 5) is provided by an electrically conductive compressible first gasket 20. The first gasket 20 is formed of electrically conductive material. In the exemplary embodiment, the first gasket 20 is made up of small-diameter woven wire of proper stiffness such that it is readily pliable and will conform to the front panel 300, regardless of shape irregularities and imperfections in the surface of the front panel 300. In other embodiments, the first gasket 20 may be formed from a compressible and pliant plastic. The first gasket 20 includes four sidewalls 24, and a recessed portion 22 defined in a middle of one of the sidewalls 24. The first gasket 20 touches both a rear surface 302 of the front panel 300 and an exterior perimeter of the cage 40, by way of the four sidewalls 24 thereof, to thereby provide an electrical connection and a substantially continuous mechanical connection between them. The first gasket 20 helps to provide EMI shielding by grounding the front panel 300 to the cage 40 which is grounded to ground circuits of the circuit board 200. The first gasket 20 includes a front surface 28 opposite to the rear surface 302 of the front panel 300, and a rear surface 26 opposite to the front surface 28. The rear surface 26 has adhesive thereon to affix the first gasket 20 to the supporting frame 30.

The supporting frame 30 is configured for supporting the first gasket 20. The supporting frame 30 is preferably sized and shaped so as to assist in compressing the first gasket 20 between the rear surface 302 of the front panel 300 and the cage 40. The supporting frame 30 includes a supporting body 32, a plurality of supporting portions 34 perpendicularly extending from the supporting body 32, and a plurality of soldering portions 36. The supporting body 32 includes a top panel 322, two bottom panels 326, two side panels 324 interconnecting the top panel 322 and the bottom panels 326, and a breach 328 between the two bottom panels 326. A width of the breach 328 is greater than that of the tongue 482 of the cage 40. The supporting portions 34 respectively bend perpendicularly from inner surfaces to outer surfaces of middle portions of the top panel 322, the two side panels 324 and the two bottom panels 326. The soldering portions 36 are formed at joints between the top panel 322 and the two side panels 324, and between the two side panels 324 and the two bottom panels 326, and a distal end of each of the bottom panels 326.

The second gasket 50 is fabricated as a pad from conductive material. The second gasket 50 is disposed about an outer periphery of the rear end portion 43 of the cage 40, and touches the outer surfaces 49 of the back wall 46 and the sidewalls 44 of the cage 40, and a surface of the circuit board 200 to help to shield the module from external electromagnetic waves, as well as to contain electromagnetic waves emanating from the module in the cage 40. The second gasket 50 includes three sidewalls 54 each including an inner surface 52 having conductive adhesive for securing the second gasket 50 to the rear end portion 43 of the cage 40.

Figure 3:
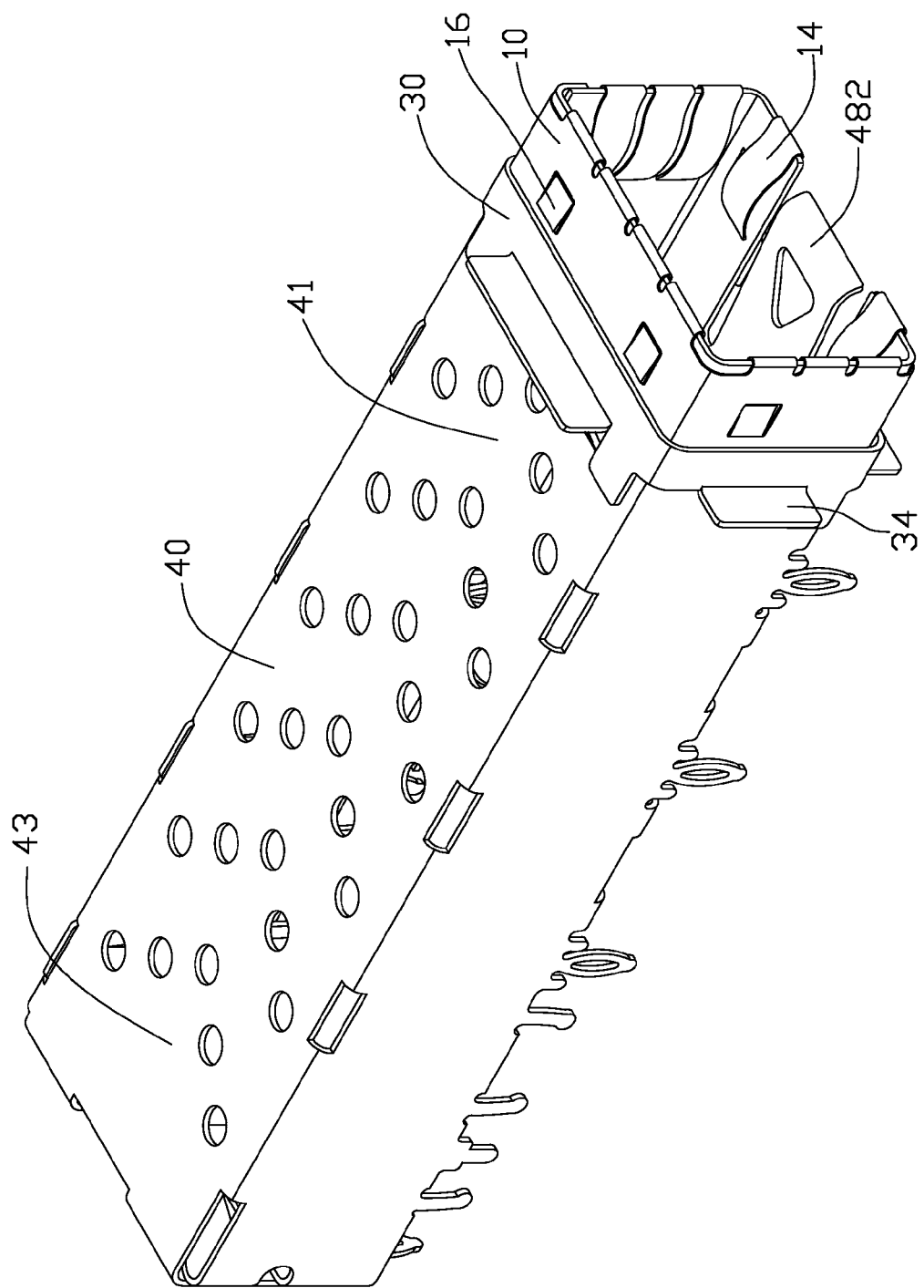
FIG. 3 is an assembled view of the shielding frame, the shielding cage and the supporting frame of FIG. 1.
Figure 5:
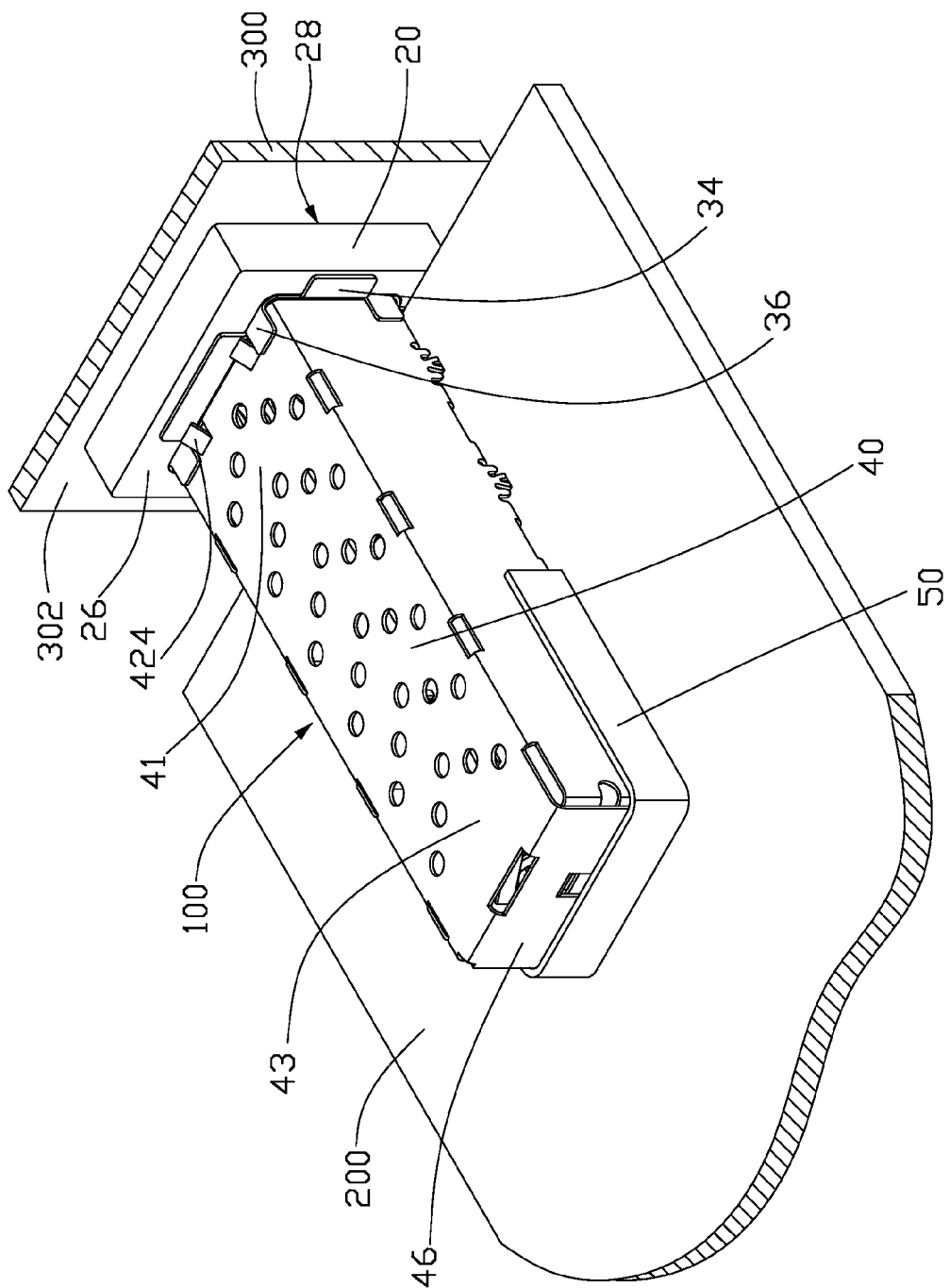
FIG. 5 is an assembled view of the assembly of FIG. 4 installed in a device.

Referring to FIGS. 3-5, in assembly, the shielding plate 10 is mounted to the front end portion 41 of the cage 40 with the clips 45 of the cage 40 projecting out of the hatched 16 of the shielding plate 10, and two of the tabs 14 of the shielding plate 10 respectively clamping the locating plates 484 of the bottom wall 48 of the cage. The supporting frame 30 is attached to the front end portion 41 of the cage 40 and overlaps the shielding plate 10 with the stop portions 424 abutting against the supporting portions 34, and the side panels 324 of the supporting frame 30 holding the sidewalls 44 of the cage 40 and the shielding plate 10. The soldering portions 36 are coupled to the sidewalls 44 of the cage 40 by soldering. Thus, the shielding plate 10, the cage 40, and the supporting frame 30 are mounted together to form an assembly. The first gasket 20 overlaps the shielding plate 10 and the supporting frame 30 with the rear surface 26 of the first gasket 20 being affixed to the supporting portions 34 of the supporting frame 30, and the recessed portion 22 corresponding to the tongue 482 of the cage 40. The inner surfaces 52 of the second gasket 50 are affixed to the rear end portion 43 of the cage 40 to mount the second gasket 50 to the cage 40. Thus, the cage 40, the first gasket 20, the second gasket 50, the shielding plate 10, and the supporting frame 30 are mounted into the shielding assembly 100. Then the shielding assembly 100 is installed on the circuit board 200 by the legs 442 of the cage 40 being inserted into the circuit board 200. The assembly of the shielding assembly 100 and the circuit board 200 is installed in the device with the front surface 28 of the first gasket 20 abutting against the rear surface 302 of the front panel 300.

When the module is inserted into the cage 40, front gaps between the module and the cage 40 in the front end portion 41 are sealed by the plurality of tabs 14 of the shielding plate 10. Thus, electromagnetic waves from external sources cannot enter the cage 40 through the front gaps, and the electromagnetic waves emanating from within the module cannot escape through the front gaps.

Because the second gasket 50 is attached to the rear end portion 43 of the cage 40, back gaps between the cage 40 and the circuit board 200 are sealed by the second gasket 50. Therefore, electromagnetic waves from external sources cannot enter the cage 40 through the back gaps, and the electromagnetic waves emanating from the module and the connector cannot escape through the front gaps.

While exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A shielding assembly mounted on a circuit board, comprising:

a cage comprising an outer surface, a front end portion, a rear end portion opposite to the front end portion, a plurality of stop portions, and a plurality of clips, the stop portions and the clips respectively protruding from the outer surface;

a shielding plate mounted to the front end portion of the cage, the shielding plate comprising a main portion, a plurality of tabs projecting from an inner surface of the main portion and configured for reducing electromagnetic interference, and a plurality of hatches for receiving the clips;

a supporting frame installable on the front end portion and overlapping the shielding plate, the supporting frame comprising a supporting body and a plurality of supporting portions extending from the body portion; and a gasket overlapping the shielding plate and the supporting frame for reducing electromagnetic interference, the gasket comprising a rear surface abutting against the supporting portions.

2. The shielding assembly of claim 1, wherein the cage further comprises an inner surface opposite to the outer surface, the stop portions and the clips are respectively stamped outward from the inner surface to the outer surface.

3. The shielding assembly of claim 1, wherein the cage further comprises a top wall, a pair of parallel sidewalls, and a bottom wall parallel to the top wall, the sidewalls interconnecting the top wall and the bottom wall.

4. The shielding assembly of claim 3, wherein the stop portions are arranged on the top wall.

5. The shielding assembly of claim 3, wherein the clips are arranged on the top wall, the sidewalls, and the bottom wall, distal ends of the clips and the stop portions extend toward each other.

6. The shielding assembly of claim 1, wherein the supporting body comprises a top panel, two bottom panels, two side panels interconnecting the top panel and the bottom panels, and a breach between the two bottom panels.

7. The shielding assembly of claim 6, wherein the supporting portions bend vertically from middle portions of the top panel, the side panels, and the bottom panels.

8. The shielding assembly of claim 6, wherein the supporting frame further comprises a plurality of soldering portions formed at joints between the top panel and the two side panels, and between the two side panels and the two bottom panels, and a distal end of each of the bottom panels.

9. A shielding assembly for protecting an electrical module from electromagnetic interference, the shielding assembly comprising:

a cage comprising a front end portion, a rear end portion opposite to the front end portion, a plurality of clips protruding from the front end portion, a top wall, a pair of parallel sidewalls, and a back wall;

a shielding plate attached to the front end portion of the cage, the shielding plate comprising a main portion, a plurality of resilient tabs projecting from an inner surface of the main portion and configured for reducing electromagnetic interference, and a plurality of through hatches in the main portion for receiving the clips; and a gasket attached to the rear end portion and abutting against outer surfaces of the sidewalls and the back wall.

10. The shielding assembly of claim 9, further comprising a supporting frame mounted to the front end portion and overlapping the shielding plate.

11. The shielding assembly of claim 10, wherein the supporting frame comprises a supporting body and a plurality of supporting portions extending vertically from the supporting body.

12. The shielding assembly of claim 11, wherein the cage comprises a plurality of stop portions stamped from the top wall and abutting against one of the supporting portions.

13. The shielding assembly of claim 1, wherein the supporting body comprises a top panel, two bottom panels, two side panels interconnecting the top panel and the bottom panels, and a breach between the two bottom panels.

14. The shielding assembly of claim 13, wherein the supporting frame further comprises a plurality of soldering portions formed at joints between the top panel and the two side panels, and between the two side panels and the two bottom panels, and a distal end of each of the bottom panels.

15. The shielding assembly of claim 9, further comprising another gasket affixed to the supporting frame for reducing electromagnetic interference.

16. The shielding assembly of claim 15, wherein the another gasket is formed from a compressible and pliant plastic.

* * * * *